(12) United States Patent
Krueger et al.

(10) Patent No.: US 7,388,281 B2
(45) Date of Patent: Jun. 17, 2008

(54) ENCAPSULATED ELECTRONIC COMPONENT AND PRODUCTION METHOD

(75) Inventors: Hans Krueger, Munich (DE); Jürgen Portmann, Munich (DE); Karl Nicolaus, Munich (DE); Gregor Feiertag, Munich (DE); Alois Stelzl, Munich (DE)

(73) Assignee: EPCOS AG, Munich (DE)

( * ) Notice: Subject to any disclaimer, the term of this patent is extended or adjusted under 35 U.S.C. 154(b) by 21 days.

(21) Appl. No.: 10/523,875

(22) PCT Filed: Jun. 23, 2003

(86) PCT No.: PCT/EP03/06596

§ 371 (c)(1),
(2), (4) Date: Feb. 7, 2005

(87) PCT Pub. No.: WO2004/019490

PCT Pub. Date: Mar. 4, 2004

(65) Prior Publication Data
US 2006/0151203 A1    Jul. 13, 2006

(30) Foreign Application Priority Data
Aug. 22, 2002  (DE)  ................................. 102 38 523

(51) Int. Cl.
*H01L 23/02* (2006.01)
*H01L 23/48* (2006.01)
*H01L 23/52* (2006.01)
*H01L 29/40* (2006.01)

(52) U.S. Cl. ...................... 257/678; 257/738; 257/778; 257/E23.127

(58) Field of Classification Search .............. 257/678, 257/737–738, 777–796
See application file for complete search history.

(56) References Cited

U.S. PATENT DOCUMENTS 3,587,322 A    6/1971  Lobdell et al.

(Continued)

FOREIGN PATENT DOCUMENTS

DE    198 06 818    11/1999

(Continued)

OTHER PUBLICATIONS

Peter Selmeier et al, Recent Advances in Saw Packaging; IEEE Ultrasonics Symposium; 2001; pp. 283-292.

(Continued)

*Primary Examiner*—Cuong Q Nguyen
(74) *Attorney, Agent, or Firm*—Fish & Richardson P.C.

(57) ABSTRACT

The present invention relates to an encapsulated component that includes a carrier substrate and at least one chip positioned on the top of the carrier substrate and electrically connected to it by means of electrically conductive connections. The encapsulation of the chip is accomplished with a seal or dielectric layer. As a result of differing coefficients of expansion of the seal or dielectric layer and the electrically conductive connections, with changing temperatures stresses occur in the electrically conductive connections, which can lead to cracks, breaks and even to interruption of the electrically conductive connections. To mechanically relieve the electrically conductive connections of stresses from changing temperatures (in particular under extreme thermal loads), it is proposed that the carrier substrate be provided with a support element that encircles the chip, which serves to support the seal or dielectric layer, and/or that the material and the arrangement of the encapsulation be selected accordingly.

25 Claims, 6 Drawing Sheets

U.S. PATENT DOCUMENTS

| | | | |
|---|---|---|---|
| 4,424,419 A | 1/1984 | Chaput et al. | |
| 4,454,440 A | 6/1984 | Cullen | |
| 4,866,683 A | 9/1989 | Phillips | |
| 5,184,107 A | 2/1993 | Maurer | |
| 5,216,490 A | 6/1993 | Greiff et al. | |
| 5,650,685 A | 7/1997 | Kosinski et al. | |
| 5,739,585 A | 4/1998 | Akram et al. | |
| 5,990,418 A * | 11/1999 | Bivona et al. | 257/778 |
| 6,150,753 A | 11/2000 | DeCastro | |
| 6,178,249 B1 | 1/2001 | Hietanen et al. | |
| 6,324,907 B1 | 12/2001 | Halteren et al. | |
| 6,400,065 B1 | 6/2002 | Toda et al. | |
| 6,433,412 B2 * | 8/2002 | Ando et al. | 257/678 |
| 6,492,194 B1 * | 12/2002 | Bureau et al. | 438/106 |
| 6,732,588 B1 | 5/2004 | Mullenborn et al. | |
| 6,781,231 B2 | 8/2004 | Minervini | |
| 6,800,987 B2 | 10/2004 | Toda | |
| 6,809,413 B1 | 10/2004 | Peterson et al. | |
| 6,829,131 B1 | 12/2004 | Loeb et al. | |
| 6,904,155 B2 | 6/2005 | Yonehara et al. | |
| 6,924,429 B2 | 8/2005 | Kasai et al. | |
| 6,930,364 B2 | 8/2005 | Bruner | |
| 7,072,482 B2 | 7/2006 | Van Doorn et al. | |
| 7,092,539 B2 | 8/2006 | Sheplak et al. | |
| 7,166,910 B2 | 1/2007 | Minervini | |
| 7,242,089 B2 | 7/2007 | Minervini | |
| 7,259,041 B2 | 8/2007 | Stelzl et al. | |
| 2002/0110256 A1 | 8/2002 | Watson et al. | |
| 2003/0034536 A1 | 2/2003 | Scheeper et al. | |
| 2003/0035558 A1 | 2/2003 | Kawamura et al. | |
| 2004/0046245 A1 | 3/2004 | Minervini | |
| 2005/0018864 A1 | 1/2005 | Minervini | |
| 2005/0185812 A1 | 8/2005 | Minervini | |
| 2006/0157841 A1 | 7/2006 | Minervini | |
| 2007/0082421 A1 | 4/2007 | Minervini | |
| 2007/0099327 A1 | 5/2007 | Hartzell et al. | |
| 2007/0201715 A1 | 8/2007 | Minervini | |
| 2007/0202627 A1 | 8/2007 | Minervini | |

FOREIGN PATENT DOCUMENTS

| | | |
|---|---|---|
| EP | 0 742 643 | 11/1996 |
| FR | 2 799 883 | 10/1999 |
| JP | 07212180 | 8/1995 |
| JP | 07212181 | 8/1995 |
| JP | 10321666 | 12/1998 |
| WO | WO99/43084 | 8/1999 |
| WO | WO99/56390 | 11/1999 |
| WO | WO00/70630 | 11/2000 |
| WO | WO01/26136 | 4/2001 |
| WO | WO02/15636 | 2/2002 |

OTHER PUBLICATIONS

Barton et al "Optimisation of the Coating of a Fiber Optical Sensor Embedded in a Corss-ply GFRP Laminate" Composites: Part A 33 (2002) 27-34.

Bergqvist, J. and Rudolf, F., "A Silicon Condenser Microphone Using Bond and Etch-Back Technology", Sensors and Actuators A, vol. 45, pp. 115-124 (1994).

Torkkeli, et al., "Capacitive Silicon Microphone", Physica Scripta., vol. T79, pp. 275-278 (1999).

* cited by examiner

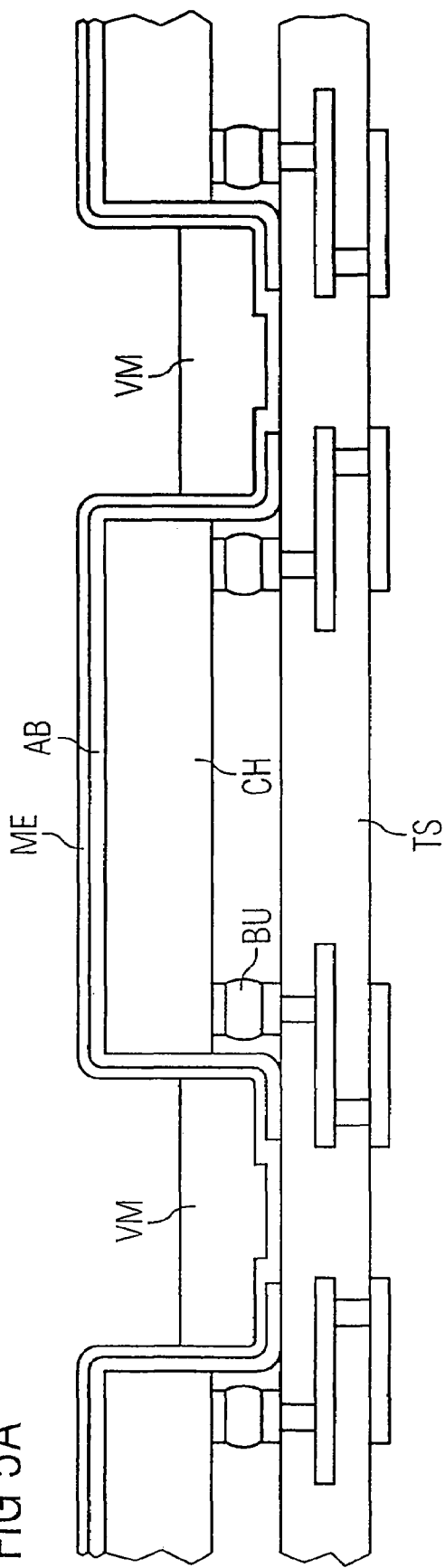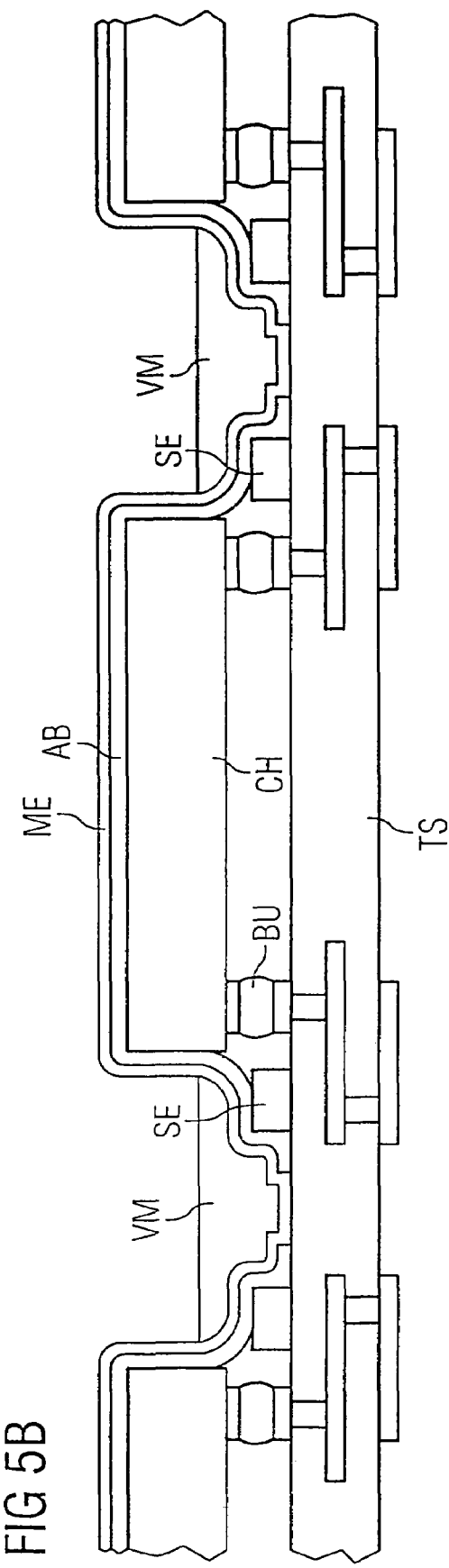

ENCAPSULATED ELECTRONIC COMPONENT AND PRODUCTION METHOD

TECHNICAL FIELD

This patent application relates to an encapsulated component in which there is a gap between a carrier substrate and the active surface of a chip. For example, the application relates to a surface acoustic wave component that contains a carrier substrate and a chip which is located on the top side of the carrier substrate, and is electrically and mechanically connected to it by bumps or other electrically conductive connections. The chip may be mounted on a substrate, such as a piezoelectric substrate in the case of an acoustic component, with the surface of the chip that faces the carrier substrate, referred to hereinafter as the underside, carrying electrically conductive structures, such as resonators that work with acoustic surface acoustic waves or bulk acoustic waves.

BACKGROUND

Methods have already been suggested for simple encapsulation of components to protect sensitive conductive structures on a chip from environmental influences.

It is possible, for example, to seal the space between the chip edge and the carrier substrate with an underfiller and to sputter a metal layer onto the component. The disadvantage of this method is that that the conductive structures (in particular acoustic converters) on the chip must be protected from the underfiller, for example with a plastic cap, and expensive processing steps are needed for this.

It was proposed in DE 198 06 818 A, for example, that the components be soldered onto a carrier in a flip chip arrangement and then be covered with a film, such as laminate film, which seals the components tightly with the carrier between the components.

In additional variants, it is also proposed that these films be further sealed hermetically by applying a metal layer over the film, and that this metallization be thickened for example by electroplating. In this case, freestanding bumps are involved, which are not supported by a filling compound. Because the mechanical connection between the carrier substrate and the chip comes about exclusively through the laminate film and the bumps, the bumps in particular endure the shear and/or tension stresses that occur in the chip under mechanical effects.

In particular as a result of differing coefficients of expansion of the laminate film or seals and the bumps, under strong and abrupt temperature changes, the bumps are exposed to mechanical strains that can result in cracks, breaks, and even in the bumps breaking off.

SUMMARY

Described herein is a way of reducing mechanical strains on electrically conductive connections in a component having a flip chip construction, such as bump connections, under extreme thermal loads.

Described herein is a chip with electrically conductive structures on a surface referred to below as the underside of the chip, and a carrier substrate that is electrically and mechanically connected to this chip. The carrier substrate has connecting surfaces on its top side for making contact with the chip. The one or more chips is/are mounted on a carrier substrate in flip chip construction with the help of electrically conductive connections, such as soldered connections, in particular bump connections (bumps), with the connecting surfaces of the carrier substrate being electrically connected to the electrically conductive structures of the chip.

Between the carrier substrate and the active surface of the chip there is a gap.

To relieve the electrically conductive connections, there is a support element positioned on the top side of the carrier substrate, which encircles the chip without touching it. The support element may be formed by a closed frame located on the top side of the support substrate, which encircles the chip. Furthermore, the component includes a seal that surrounds the chip, and tightly seals at least the space between the chip and the support element, which encircles it. In so doing, the seal is supported on the support element.

The carrier substrate of the component can include one or more dielectric layers, made for example of a plastic, in particular organic plastic, silicon, silicon oxide or ceramic, in particular LTCC or HTCC ceramic (LTCC=low temperature cofired ceramic, HTCC=high temperature cofired ceramic).

The ceramic can be a non-shrink ceramic. This produces only a slight change in dimension when sintering, so that a geometry specified in the green film remains largely intact during sintering, or at least undergoes only a slight dimensional loss in a reproducible manner due to sintering shrinkage. With LTCC ceramics it is possible to provide the green films with cost-effective metallization, the tolerance of which for the low sintering temperatures of the LTCC ceramic is ensured.

It is also possible, however, to design the carrier substrate as a PCB (printed circuit board) in the form of a single-layer or multi-layer circuit board on a plastic base.

The dielectric layers are separated from each other by metallization layers, with the top side and the underside of the carrier substrate also forming metallization layers, which have at least connecting surfaces for making contact with the chip or external contacts for soldering the component onto a system carrier (such as a circuit board). The metallization layers contain, for example, electrical connecting conductors, signal through-connectors or integrated circuit elements (selected from an inductance, a capacitance or a conductor), which are formed in a known manner by conductor strips or conductor surfaces. The metallization layers are connected with each other by through connections.

The chip in the component includes a carrier substrate that may contain one or more dielectric layers which are separated from each other by metallization layers, with the top side or the underside of the carrier substrate also representing a metallization layer. The structure of the metallization layers and their connection with each other are as described above. The substrate can contain, for example, one or more layers of plastic, silicon or silicon oxide. The chip side intended as the metallization layer can have at least passive, non-linear or active component structure, in particular a diode or a transistor.

The component can be, in particular, a surface acoustic wave component, in which the chip includes a substrate with at least one piezoelectric layer, where one side of the chip (for example, the underside of the chip) has at least one surface acoustic wave converter or one bulk acoustic wave resonator.

The substrate can contain a plurality of dielectric layers and metallization layers, as described above.

The component described herein can also be a MEMS component (MEMS=microelectromechanical system, MOEMS=micro-optoelectromechanical system) or a semiconductor component, such as an integrated circuit based on the semiconductor.

The seal can be made of a dielectric material, e.g., a filling compound such as resin, Glob-Top, underfiller, glue, or a plastic, in particular an organic plastic, a metal solder, glass solder or laminate film.

The seal at least partially covers the side surfaces of the chip and the sections of the support element that encircles it, and can completely or partially fill the space between the side surfaces of the chip and the support element.

In an embodiment, the seal is designed as a dielectric layer which also covers the top side of the chip. The dielectric layer can be formed by a filling compound, for example resin or a plastic layer, in particular a layer of an organic plastic or a glass solder or by a laminate film.

The dielectric layer can be made up of one or more layers, which, for example, realize various functions. It is advantageous if one of the aforementioned layers exhibits especially low moisture absorption or especially good impermeability to gas. Suitable for this are layers of an LCP material (liquid crystal polymer). It is useful, especially in the case of a dielectric layer realized as a film, which adheres poorly to the carrier substrate or chip, to provide an additional bonding layer.

The top layer in the structure of the dielectric layer can be an additional layer that is suited for laser inscription. It is possible that one of the layers in the structure of the dielectric layer is also suitable for filling the intermediate spaces between the chips on a large-area carrier substrate (panel). This layer can be realized with a filling compound.

It is also possible for the aforementioned seal to be combined with one or more of the aforementioned dielectric layers.

It is possible for the dielectric layer to completely cover the support element and the chip, and to form a seal with the carrier substrate only outside of the support element. Between the dielectric layer and the top side of the carrier substrate, there is a cavity, in which both the chip and the support element encircling it are enclosed. The support element can be of a hermetically tight or a non-hermetically-tight material.

In another embodiment, the seal is a dielectric layer which completely covers the chip and seals it tightly with the support element, with the outside of the support element not being covered by the seal. Here the support element is correspondingly of a hermetically tight material, and can form a part of the sidewall of the component.

In a method of producing a component described herein, the large-area carrier substrate (panel), populated with a number of chips, is laminated at a comparatively high temperature with a plastic film, which is stretched over the chip and the support element encircling it as it cools.

If the component is not yet hermetically sealed in this state, the hermetic condition is produced by an additional layer. This requires that the hermetic layer, for example a Cu layer, be sealed together with the support element or with the carrier substrate in the area between the installation locations of the chips. For this reason, the dielectric layer is removed at these places.

It is also possible to have the hermetic layer sealed directly to the surface of the carrier substrate at the edge of the component in a (ring-shaped) closed strip, with several or all of the chips of the component being located inside this closed strip. In this case the hermetic layer lies on the support element between the chips, and the chips of the component are hermetically tightly encapsulated not individually, but collectively.

It is possible for the component to include a plurality of like or different chips with passive or active components, which are located on the top side of the carrier substrate and encapsulated in the same way.

It is possible for the component also to include one or more discrete components, selected, for example, from a capacitor, a resistor or a coil.

Various methods are used to produce the electrically conductive connections, in the form of bumps. The bumps can be produced on the connection surfaces in the conventional way, by electroplating, for example by depositing SnPb, SnAg, SnCu, SnAgCu or SnAu. The electroplating can be followed by remelting, which results in formation of the corresponding alloy.

It is also possible to produce the bumps in a conventional way by screen or template printing with soldering paste, and then carrying out a reflow process in which the bumps acquire their spherical geometry.

It is also possible to produce the bumps by directed stamping of cylinders of soldering foil over the through connections of the topmost layer of the carrier substrate.

Alternatively, the bumps can also be produced on the solderable metallizations on the underside of the chip. This can also be done for example by electroplating over the corresponding metallizations. A solder jet method is also possible. Also possible is template printing of solder deposits on the metallizations, followed by a remelting process. Because here too the wettability of the solderable metallizations makes the structuring easier, a difference in the wettability of metallic structures can be used to structure the bumps on the chip or in the wafer state. For example, it is possible to passivate a large part of the metallization located on the chip (the underside of the chip), for example by producing an anodic oxide layer, which can also be covered with an applied mineral layer, for example a thin layer of silicon oxide or a thin layer of silicon nitride. The surfaces that are not covered by this passivation then remain wettable with solder, or specially wettable with solder by suitable additional layers, so-called under-bump metallizations—UBMs—, while the passivated surfaces of the metallization represent the solder resist mask.

The support element located on the carrier substrate surrounds an interior space, which represents and geometrically defines the location for receiving the chip.

The support element can reach to above the level of the lower or upper edge of the chip. It is also possible, however, for the support element to be lower than the lower edge of the chip.

As an elevated structure, the support element is made of plastic, solder or metal, and can be produced as an integrated unit together with other components or structures of the carrier substrate. A support element made of metal or having metallization has the advantage that the metallization produces good contact, adhesion and wetting to the seal or dielectric layer, so that hermetic sealing of the entire component, and in particular of the conducting structures on the underside of the chip, is guaranteed. It is also possible, however, for the surface of the support element to have no metallization.

The support element can also be a ceramic material or a plastic, e.g., a plastic with a very low water absorption capacity (for example highly filled plastic or liquid crystal polymer).

The support element can also be produced with or using solderable metallizations. First metallization is produced on the carrier substrate at the places intended for the support element, for example, in a sputter process. The support element can then be produced by thickening this metallization by electroplating. A sequence of layers of titanium (for better adhesion) and copper can be produced. Sufficient thickness of this layer can be produced already by sputtering, for example 100 to 200 nm titanium and more than 6 μm copper. It is also possible, however, to produce a thin titanium/copper layer (0.1 to 2 μm copper) and then to thicken this by electroplating. Structuring of the support element may occur with the help of a photoresist mask by structured sputtering. The mask can also be designed so that it can remain on the support substrate during the galvanic thickening process.

It is possible for the support element to be provided in the form of an individual frame for every chip located on the top side of the carrier substrate. It is also possible for the support element to be formed as a frame from a solid block, with recesses for each chip.

The use of the support element encircling the chip when encapsulating the component with the help of a seal has the advantage that mechanical forces acting on the electrically conductive connections, which occur in particular under thermal loading and can lead to cracks, are reduced by supporting the seal on the support element, which contributes to mechanical relief of the electrically conductive connections.

One problem addressed by the structures described herein is to reduce overload of the electrically conductive connections. A chip is proposed with electrically conductive structures on the underside of the chip, and a carrier substrate which has connecting areas on the surface, with the chip being mounted in flip chip construction on the carrier substrate by conductive connections, and with the connecting areas being electrically connected to the electrically conductive structures of the chip by electrically conductive connections. Located on the top side of the chip is a cover, in particular a composite of a dielectric layer and above it a metal layer, with this composite forming a sealed connection with the carrier substrate around the chip outside of the chip area. To relieve the electrically conductive connections (e.g., bumps), the chip thickness in the component is chosen so that the forces occurring due to the thermal expansion of the aforementioned composite in the temperature range between −60° C. and 85° C. are a maximum of 2 Newtons per electrically conductive connection (per bump).

A force of over 2 Newtons acting on an electrically conductive connection, in particular a bump, leads to bump cracks; this can be avoided by a suitable choice of the thickness of the layer. With common chip sizes and bump arrangements used with them, this normally requires a reduction in the thickness of the chip. With this embodiment of the component relief of the electrically conductive connections (bumps) is achieved without a support element, which saves the corresponding procedural step to place the support element on the carrier substrate.

In another embodiment, it is proposed that a dielectric layer of polymer material with a modulus of elasticity of less 1 GPa than be used, or a thin film whose thickness is less than 20 μm. In the aforementioned materials, with changing temperatures the deformation of the electrically conductive connection is reduced by the fact that the deformation does not occur in the solder or in the electrically conductive connections, but in large part in the dielectric layer or in the film.

Alternatively, it is possible to use a dielectric layer or a film that has a low coefficient of thermal expansion, or in which the coefficient of thermal expansion is reduced by mixing in an inorganic filler material. A dielectric layer with a coefficient of thermal expansion that corresponds to that of solder or of the material of the electrically conductive connections is used. It is also possible for the thermal expansion coefficient of the material of the dielectric layer to be selected between $\alpha_{bump}/2$ and $2\alpha_{bump}$.

For structuring of such dielectric layers or films with filler materials to be possible, e.g., particles whose diameter is smaller than 1 μm are used.

In another embodiment, a component is also proposed that contains a chip with electrically conductive structures on the underside of the chip and a carrier substrate which has connecting area on the surface, with the chip being mounted in flip chip arrangement on the carrier substrate by conductive connections, and with the connecting areas being electrically connected to the electrically conductive structures of the chip by electrically conductive connections. The component also contains a support element located on the top side of the carrier substrate in the form of a shrink frame, which encircles the chip and tightly encloses it. This embodiment has the advantage that the shrink frame simultaneously supports the chip being encapsulated and seals it tightly together with the carrier substrate, so that in this case in principle no additional seal is necessary. If the shrink frame is not sufficiently gas-tight, the hermetic quality of the parts can be produced by an additional hermetically tight layer, e.g., by a metal layer.

A method is also described, which includes the following:
- at least two chips carrying conductive structures are attached by electrically conductive connections in flip chip arrangement to a carrier substrate, which has on its surface connecting areas for electrical connection with the electrically conductive structures of the chip,
- the at least two chips are covered with a dielectric layer which lies on the top side of the chip and seals it together with the carrier substrate, so that in this way each of the at least two chips is individually encapsulated,
- the space between the at least two chips is filled with a filling compound.

It is possible to apply to the dielectric layer a metal layer that forms a composite with the dielectric layer, and then to apply the filling compound to the composite of the dielectric layer and the metal layer outside of the chip and to cure it if necessary. The carrier substrate can then be sawed apart, so that individual components result which include at least one of the aforementioned chips.

In this method of producing a component encapsulated, the relief of the electrically conductive connections is achieved with an external support element positioned over the composite and formed by the filling compound (through a lateral support function). Compared to the corresponding process step of applying a structured "internal" support element to the carrier substrate, this represents a simplification.

In the following section, embodiments are described with reference to corresponding figures.

DESCRIPTION OF THE DRAWINGS

FIGS. 5a and 5b show a component with a filling compound between the encapsulated chips, in schematic cross section.

DETAILED DESCRIPTION

Figure 1:
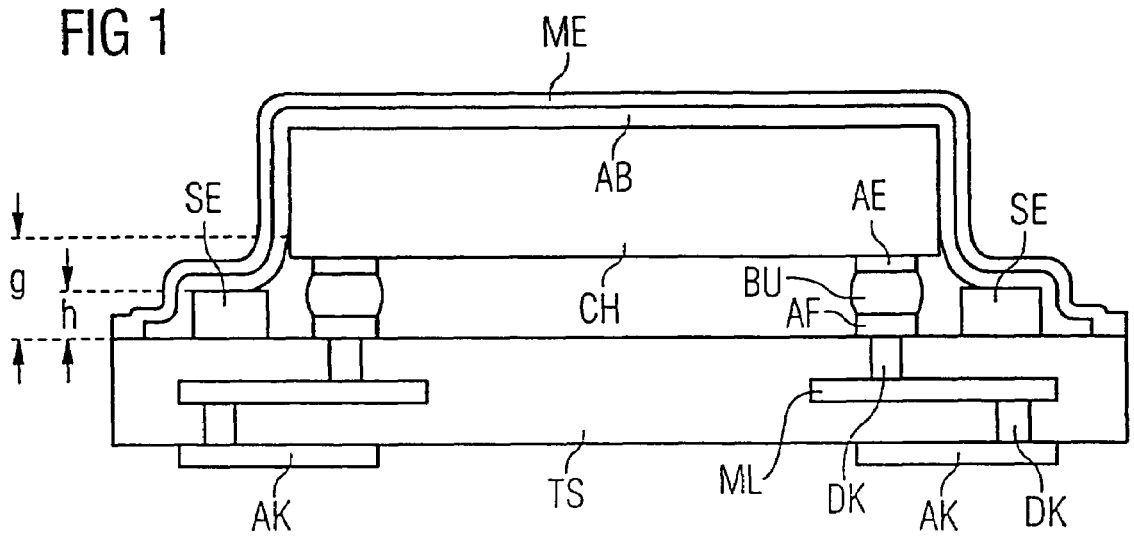
FIG. 1 shows a component encapsulated having a carrier substrate, a chip placed on it, a dielectric layer and a support element, in schematic cross section.

FIG. 1 shows a schematic cross section of a carrier substrate TS with a chip CH placed on it and a support element SE. The component includes the chip CH mounted on the carrier substrate TS in flip chip arrangement by electrically conductive connections BU, and a support element SE located on the top side of the carrier substrate, which encircles the chip.

In the component, the chip is not lying on the support element.

The chip and the support element together are covered with a seal AB in the form of a dielectric layer. In this embodiment, a metal layer ME is additionally applied to the dielectric layer AB. The metal layer serves to shield the signal-carrying chip structures from electromagnetic interference and to produce the hermetic condition.

In addition, the top side of the chip can be provided with continuous metallization, or with a layer, for example an adhesion layer, which enables better adhesion of the dielectric layer AB.

The carrier substrate TS contains one or more dielectric layers, with layers of metallization ML being provided on its top side, underside and possibly between two dielectric layers. The top side of the carrier substrate has in particular connecting areas AF, which are electrically connected to the electrically conductive structures of the chip. The underside of the carrier substrate has in particular external contacts AK (for example SMD-capable contacts; SMD=surface-mounted device). The external contacts are connected with the connecting areas and with the metallization layers ME, if any, by through connections DK. The metallization layers of the multi-layer carrier substrate can contain integrated circuit elements formed by conductor strips and metal areas, selected for example from a capacitance, an inductance, a conductor or a segment of a conductor.

The chip CH contains for example a piezoelectric substrate, whose surface (underside) bears metallizations of a surface wave component and/or at least one FBAR (thin film bulk acoustic wave resonator), referred to hereinafter as component structures. The chip can also be a multi-layer substrate with integrated circuit elements. It is possible for the top side of the chip to be metallized, for example by a Cu sputter layer that is thickened by electroplating.

The circuit elements integrated into the carrier substrate, by themselves or together with the component structures or circuit elements arranged on the chip or in the chip, can form at least a part of the following circuits: a high frequency switch, a matching circuit, an antenna switch, a diode switch, a transistor switch, a high pass filter, a low pass filter, a band-pass filter, a band-stop filter, a power amplifier, a preamplifier, an LNA, a diplexer, a duplexer, a coupler, a directional coupler, a storage element, a balun, a mixer or an oscillator.

The expansion coefficient of the support element $\alpha_{frame}$ may be approximately the same as the expansion coefficient of the electrically conductive connections $\alpha_{bump}$, and is smaller than the expansion coefficient of the cover $\alpha_{cover}$. The height of the support element over the surface of the carrier substrate can be approximately equal to or greater than the height of the electrically conductive connection or the bump height. It makes sense to choose the height of the support element h so that it is connected with the interval g between the top side of the carrier substrate and the contact point of the film on the chip, as follows:

$$h \approx g \cdot (\alpha_{bump} - \alpha_{cover})/(\alpha_{frame} - \alpha_{cover}).$$

It is also possible for the height of the support element in the entire specified temperature range (e.g., $-60°$ C. . . . $+85°$ C.) to be lower than the height of the electrically conductive connection (or bump height) at the same temperature. In this case, the width of the support element can be selected so that the inner edge of the support element lies outside the area covered by the chip, as shown in FIG. 1, or extends under the chip.

It is also possible for the height of the support element to be greater than, equal to or smaller than the distance between the top of the chip (or the underside of the chip) and the top of the carrier substrate.

The support element SE may follow the external shape of the chip CH, and is therefore in particular rectangular in shape (in the top view).

The support element can be made of metal, solder, ceramic or plastic. The support element made of plastic can be produced from a photosensitive resist, or can be structured from another layer with the help of a photolithograph or a laser. The support element of metal can be produced by screen printing or by electroplating.

Because in this example hermetic encapsulation of the chip in the component is achieved by having both the dielectric layer of the seal AB and the metal layer ME sealed together with the carrier substrate outside of the support element, it is possible for the support element to be made of a material that is not hermetically tight.

The support element can be provided on one side with an adhesion layer, glass solder or a solderable layer, for example of metal solder, so that the support element can be attached to the top side of the carrier substrate.

It is possible for the support element to be firmly connected with the carrier substrate or to form an element of the carrier substrate, in which case the support element and the carrier substrate can be of the same material and can be produced for example at the same time.

The bumps can be produced by electroplating, by a solder jet process (e.g., laser bumping), by stud bumping or by printing. Alternatively, an anisotropically conductive adhesive can also be employed, which is applied for example to the top side of the carrier substrate. In this case, signal-bearing structures (on the chip side) may need to be protected, for example by a protective cap or a protective layer.

Figure 2:
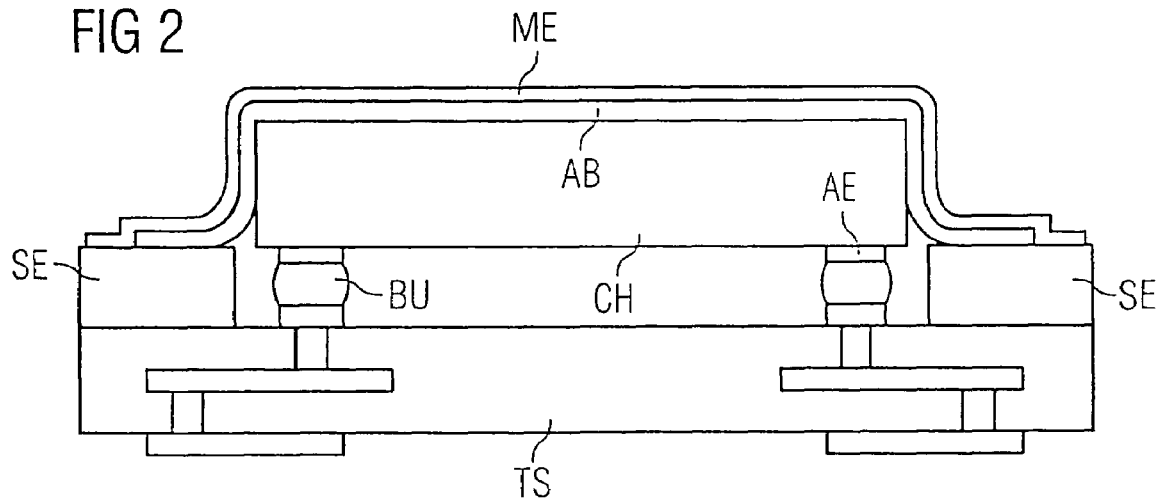
FIG. 2 shows an embodiment of the component encapsulated with the support element made of a hermetically tight material, in schematic cross section.

FIG. 2 shows another embodiment. In contrast to the embodiment presented in FIG. 1, the dielectric layer AB does not form a seal with the carrier substrate TS, but only with the support element SE. In so doing, the dielectric layer AB covers only part of the support element, so that the metal layer ME forms a seal with the area of the support element not covered by the dielectric layer. Because the support element SE here represents part of the side wall of the component, in this case hermetic encapsulation of the chip in the component is obtained if the support element is made of a hermetically tight material (e.g., ceramic, metal or solder).

Figure 3:
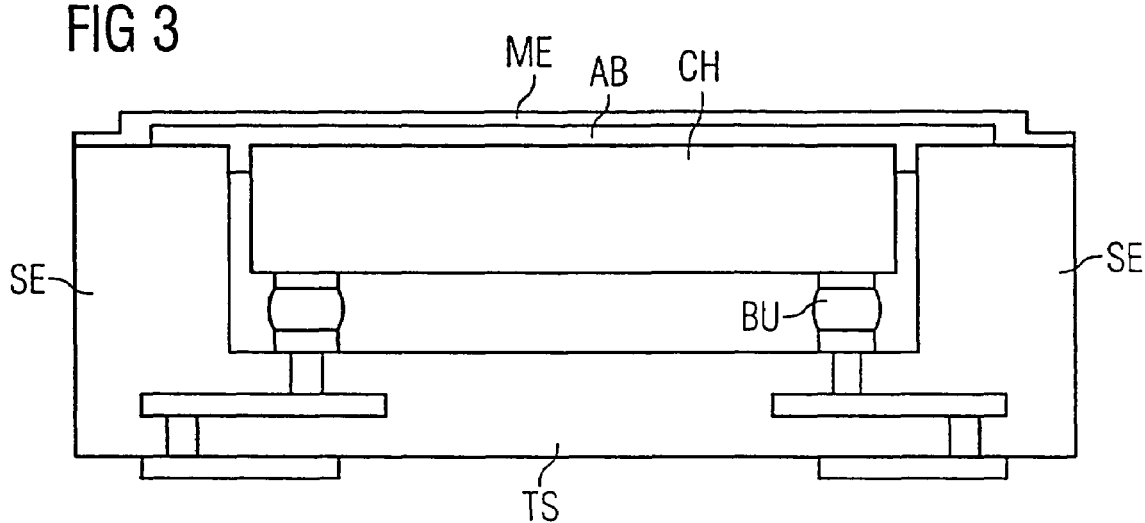
FIGS. 3 and 4 show embodiments of the component encapsulated in schematic cross section.

The embodiment shown in FIG. 3 corresponds to FIG. 2, while the support element SE here can be part of the carrier substrate TS. In this example, the height of the support element can be approximately equal to the distance between the top of the chip and the top of the carrier substrate. It is also possible for the height of the support element to be greater or less than the distance between the top of the chip and the top of the carrier substrate.

It is possible for the seal AB formed as a dielectric layer to be continuous, and to completely cover the surface of the support element. This has the benefit that such a layer is simple to apply. If the dielectric layer at the same time ensures a hermetic seal, the metal layer ME can be dispensed with.

Figure 4:
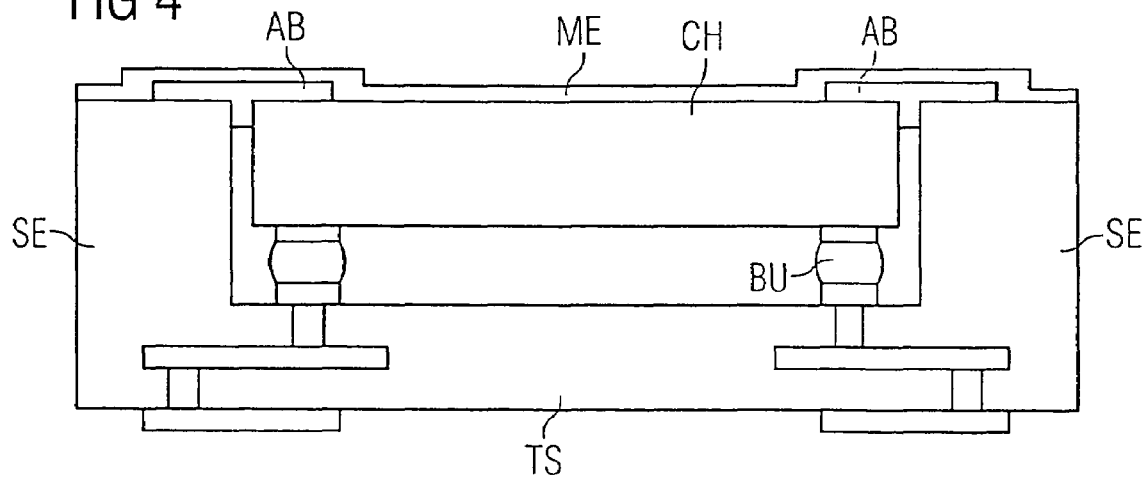

In the embodiment shown in FIG. 4, the space between the chip CH and the support element SE is sealed with the seal AB. In this case the seal covers only the adjoining or directly opposing edge areas on the top of the chip and the support element.

The seal can be of glass solder or filling compound (e.g., glue or resin). In this case, it makes sense to shield the chip, to apply a metal layer ME in such a way that it covers the top side of the chip, the seal, and the surface of the support element not covered by the seal.

It is possible for the top of the chip and the surface of the support element to be metallized even before the seal is applied, and for the seal to be of solder. In this case it is possible to dispense with the continuous metal layer, which covers in particular the seal.

FIG. 5a shows an embodiment without a support element. The chip CH is positioned on a large-area carrier substrate TS (panel), and as indicated in the figure is surrounded by additional (like or differing) chips. Each chip belongs, for example, to an installation location on the panel. The chips are encapsulated in the same manner with a dielectric layer AB. Because the dielectric layer AB generally does not permit a hermetic seal, the hermetic state is produced by an additional hermetic layer ME. To that end the hermetic layer, in particular a metal layer, for example a Cu layer, which forms a composite with the dielectric layer, is supposed to form a seal in the area between the installation locations. For this reason, the dielectric layer is removed at these places.

The relief of the electrically conductive connections is achieved here by having the spaces between the encapsulated chips at least partially filled with a filling compound VM (e.g., resin or Glob-Top) having a suitable expansion coefficient. The material and the height of this filling are selected so that the higher expansion coefficient of the dielectric layer AB (compared to the expansion coefficient of the electrically conductive connections) is compensated for, and so that the expansion coefficient of the composite of the filling compound, the dielectric layer and the metal layer ME in the area between the top side of the carrier substrate and the bottom edge of the chip is matched to the coefficients of expansion of the electrically conductive connections. After the filling compound VM has cured, the large-area carrier substrate with the chips positioned on it at corresponding individual installation locations can be separated into individual components, and in particular can be sawed apart. The separate component can contain one chip or a plurality of chips.

In the embodiment shown in FIG. 5b, the chips are encapsulated as described above and arranged on the large-area carrier substrate TS, the carrier substrate later being separated, for example sawed, into individual components. In FIG. 5b, the relief of the electrically conductive connections is achieved as in FIG. 5a by the filling compound VM and in addition by the support element SE.

In an embodiment, the filling compound is topped up to the top edge of the chip, in order to obtain a block-shaped component (after the separation by sawing), which can easily be placed during the later SMD installation.

Figure 6A:
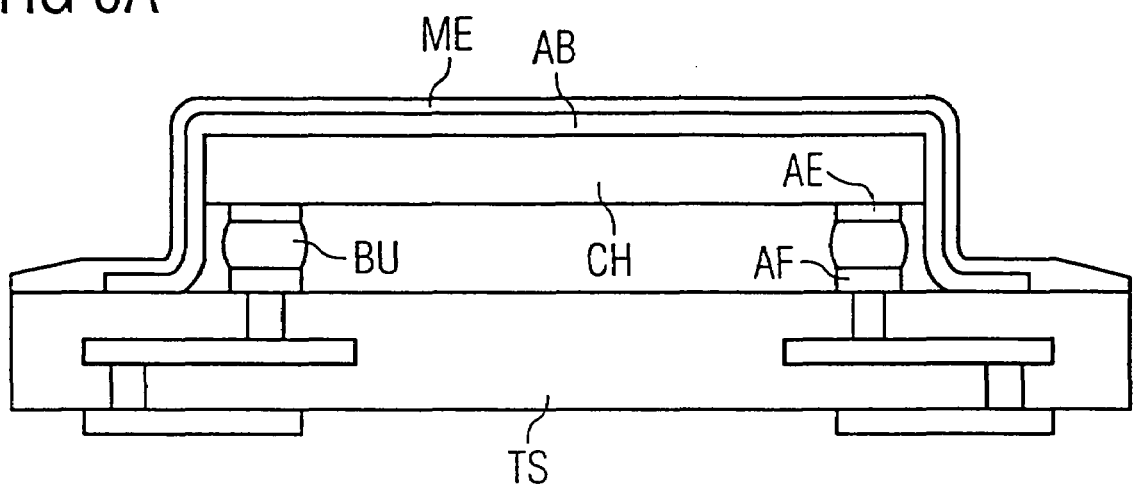
FIGS. 6a and 6b show a component with a thinned chip, in schematic cross section (in normal condition and at a substantially lower temperature).
Figure 6B:
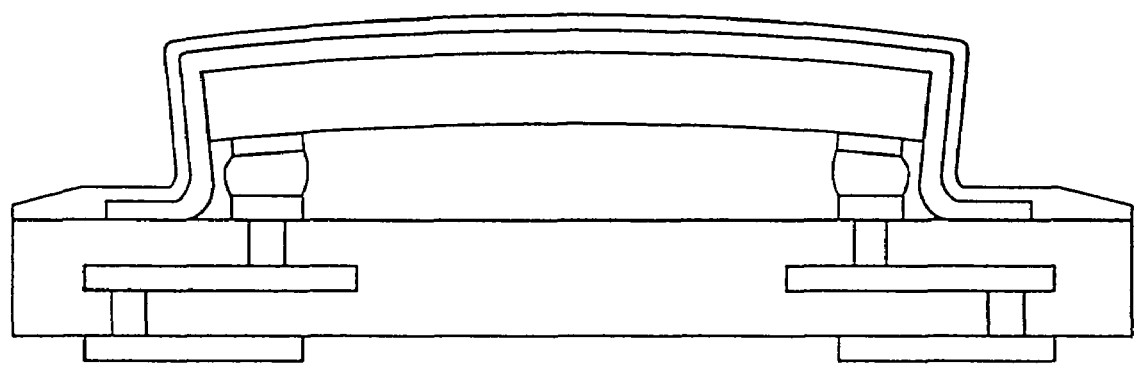

FIGS. 6a and 6b show another embodiment.

During an abrupt temperature change, the chip, the carrier substrate, the dielectric layer, the metal layer and the electrically conductive connections (e.g. bumps) undergo varying expansions due to the different, and in some cases also directionally dependent coefficients of thermal expansion. The electrically conductive connections (bumps) endure the occurring mechanical stresses, in particular shear stresses. The simulation of the component shows that cracks are caused in a bump with a diameter of about 180 μm starting at a shear force of about 2 N acting on it, which can result in impairment of the function of the component and even in the bump breaking off of the UBM (external electrodes AE on the side of the chip and connecting areas AF on the side of the carrier substrate).

It is possible to increase the tolerance to temperature changes of the component, either by selecting such a small chip thickness or by reducing it by thinning the chip to such a degree that the force needed to bend the chip CH in the entire specified temperature range (e.g., −60° C. to +85° C.) is significantly smaller than the force sufficient for the electrically conductive connections BU to break off of the UBM or the connecting area AF, or the force sufficient to form cracks in the bumps (e.g., 2 N per bump). The exact value of the chip thickness depends on the ratio of the coefficients of expansion of the dielectric layer AB and the metal layer ME, of the chip CH, the electrically conductive connections BU and of the carrier substrate TS, and on geometric factors (e.g., chip size, size of the electrically conductive connections or the distance between the electrically conductive connections), and can be ascertained by simulation.

Figure 6C:
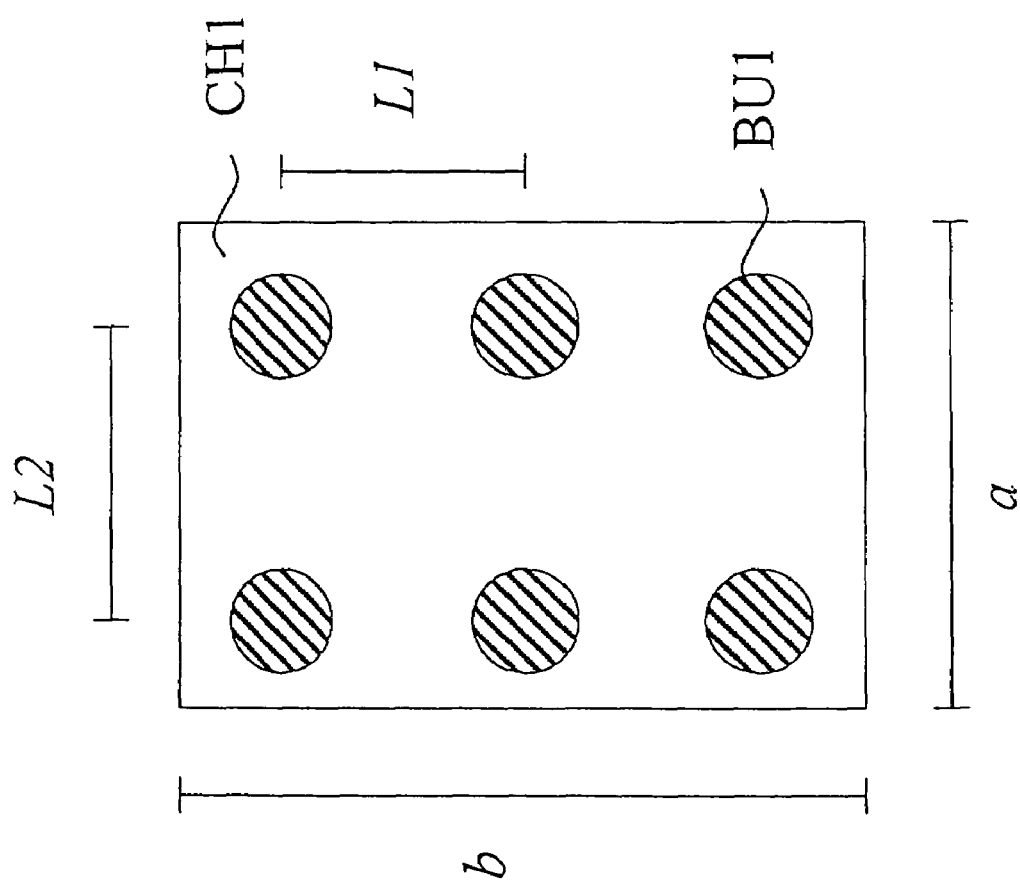
FIG. 6c shows an exemplary arrangement of the electrically conductive connections of the thinned chip in the component, in schematic cross section parallel to the chip surface.

In an embodiment shown in FIG. 6c, the chip CH1 of lithium tantalate (with a directionally-dependent coefficient of thermal expansion of about 7.0-14.3 ppm/K), width a=1.2 mm and length b=1.8 mm, is connected to a carrier substrate not shown here having a width of 2 mm and a length of 2.5 mm (with the coefficient of thermal expansion of 6.3 ppm/K) by six bumps BU1 of SnAg(3.5)Cu(0.8) (with a coefficient of thermal expansion of 20.0 ppm) having a height of 50 μm.

The bumps are arranged at equal intervals in two parallel rows of 3 bumps each along the longer edge of the chip. The spacing L1 of the bumps in a row is 800 μm. The space L2 between the rows is 900 μm. The covering over the chip includes a film 50 μm thick (with a coefficient of thermal expansion of 130.0 ppm/K in the relevant temperature range), and a 20 μm thick Cu layer over that which has a expansion coefficient of 7.1 ppm/K. Numerical simulations of the expansion behavior for the relevant temperature range have shown that the resulting force occurring per bump at a chip thickness of <250 μm is under 2 Newtons.

Thinning the Chip

In an embodiment, the chip is thinned in order to achieve relief of the electrically conductive connections. It is possible to use a DBG process (dicing before grinding) for this. In this process the not-yet-separated chips are thinned in the wafer stage, i.e., before being soldered to the carrier substrate. First one surface of the wafer (here called the underside) is sawed into along the intended sawing line or structured in some other way. The depth of the saw cut or structure indentation is less than the thickness of the wafer, and may be equal to or somewhat greater than the remaining chip thickness achieved after the thinning. Next, part of the material on the top side of the wafer is removed, while at the same time the chips are separated on the sawed and thinned wafer.

The chips can also be thinned after being soldered on. The chip, which has a thickness of around 250 µm or more, can be thinned to a thickness of 50 to 100 µm. Suited for the thinning is a particle jet with aluminum oxide particles having a diameter of <50 µm. It is also possible to grind the chip down. Before the processing with the particle jet, the areas on which cutting is to be prevented can be covered with a soft resist mask, for example, a photosensitive resist mask. It is also possible, however, simultaneously with the thinning of the chip, to remove areas of the carrier substrate or even to sever it completely by the jet process. In this case it may be necessary to cover the chip also beforehand with a mask.

In an embodiment, it is possible to pre-thin the not-yet-separated chips on the wafer, as indicated above, and to thin them further after they are soldered on using a jet process (such as sand blasting), in order in particular to achieve rounding of the edges, which is desirable for example when applying a film cover.

Figure 7A:
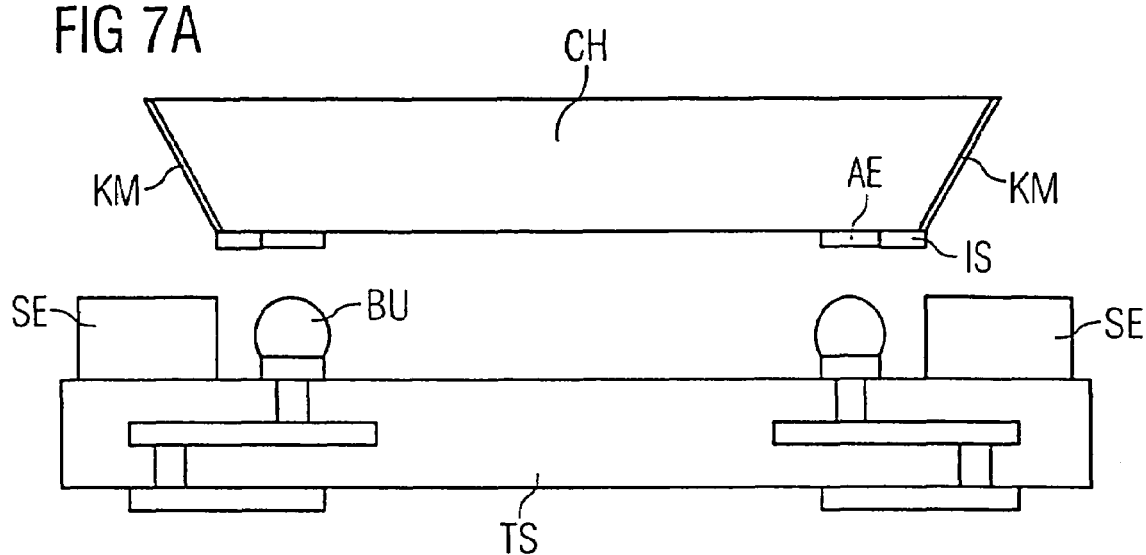
FIGS. 7a through 7c show successive process steps in the encapsulation of the component, with a chip having sloping side surfaces and a solder frame.
Figure 7B:
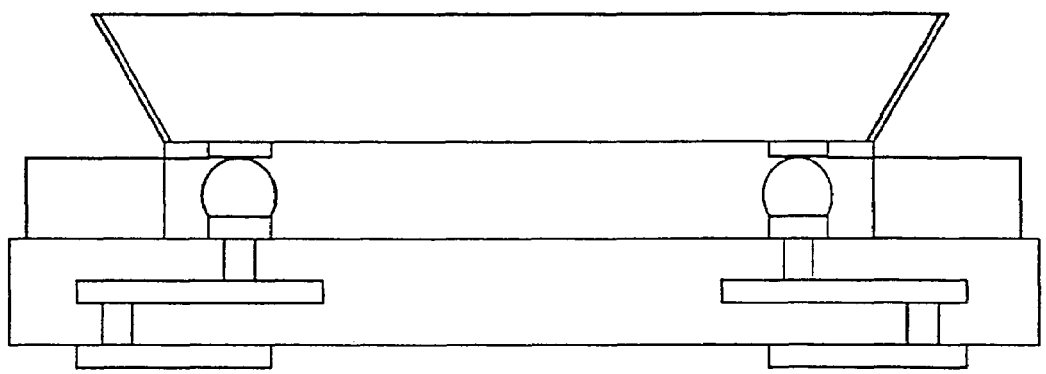
Figure 7C:
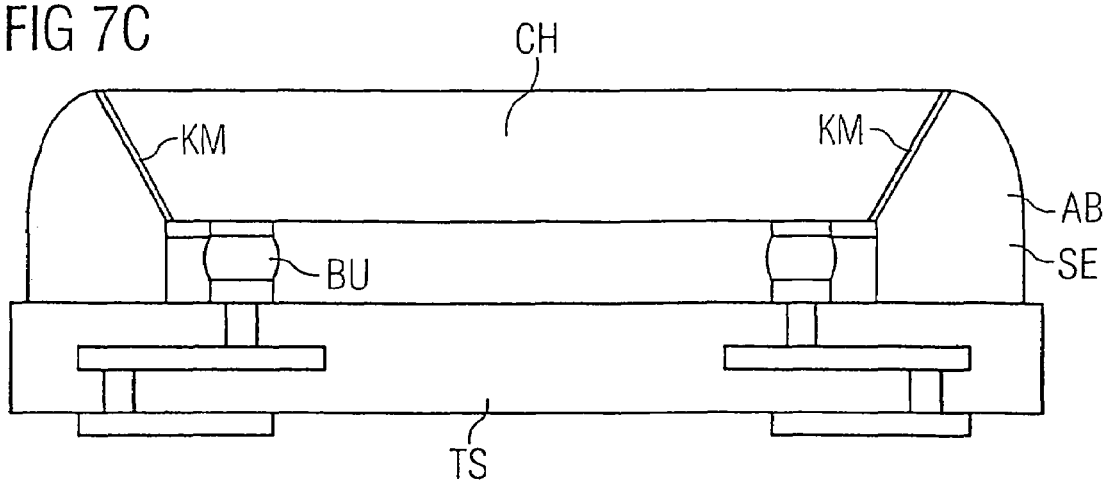

FIG. 7 shows an alternative embodiment. Here a support element SE in the form of a solder frame is produced on the carrier substrate before the chip CH is placed in position. To this end, a metallization (reference symbol AE) similar to an under-bump metallization (UBM) is produced on the carrier substrate at the places intended for the solder frame. The solder frame can then be applied by printing it on, by thickening the USM by electroplating, or also as a frame-shaped piece of soldering foil. In this version the side edges of the chip are sloped in such a way that the chip is tapered toward the surface with the electrically conductive structures, which may be applied in the later processing step (called the underside of the chip). It is then metallized on the sloping side surfaces. The metallization of the side surfaces may take place in the same process step as the production of the electrically conductive structures and the UBM on the underside of the chip.

In addition, the side surface of the chip can be vapor-plated for example with a Ti/Cu layer, so that the conductive structures on the underside of the chip can be protected with a photoresist.

In addition to the electrically conductive structures, the underside of the chip has external electrodes AE, a contact metallization KM, and positioned on the lower edge of the chip insulating, non-wetting structure IS. The insulating structures prevent a short circuit between the external electrodes AE and the contact metallization KM. They can be structured of plastic or solder resist, or can be produced by passivating the metal structures. Where there is sufficient distance between the external electrodes AE and the contact metallization KM, the insulating layer IS can be dispensed with.

The top side of the chip can be additionally provided with a metal layer for shielding purposes.

In this embodiment, the electrically conductive connections (bumps) are located on the top side of the carrier substrate TS before the chip is placed in position. The chip can then be placed on the carrier substrate (see FIG. 7b) in such a way that it is positioned with the sloping side edges over the solder frame and is supported from beneath by the electrically conductive connections (bumps). The frame height and the height of the electrically conductive connection (bump height) are selected so that the collapse of the solder or bump during the soldering causes the chip to be brought into contact with the solder frame. During the soldering a soldered connection of the solder frame to the contact metallizations KM at the side edges of the chip comes about (reference symbols AB, SE in FIG. 7c), with the soldered connection serving as a hermetic seal between the chip and the carrier substrate and with the seal AB being formed by the solder frame after the soldering.

It is possible, instead of the chip with the sloping side surfaces, to use a chip whose side surfaces have at least one step, so that in cross section the chip is approximately T-shaped. In that case the (partial) metallization of the side surfaces of the chip can take place on the step and in the same process step as the production of the electrically conductive structures and the UBM on the underside of the chip.

In another embodiment, a support element in the form of a frame exhibits shrinkage behavior, so that after temperature exposure the frame lies tightly against the chip. In this case the further sealing can be dispensed with and the component can be closed directly by a hermetically tight layer, in particular a metal layer (for example a Cu sputter layer that is thickened by electroplating), with the hermetically tight layer covering the top side of the chip and the shrink frame and forming a seal with the carrier substrate. The frame can be provided on one side with a solderable layer or with an adhesive layer, which connects the frame with the carrier substrate.

The claims are not limited to the embodiments described herein. Additional embodiments include other geometric configurations, other materials to be used, or in the employment of analogous processes with which the same effects can be achieved.

With the method described herein, a plurality of chips can be placed simultaneously on a carrier substrate of appropriately large size and can be attached and encapsulated. The carrier substrate can then be severed between individual chips, in order to separate individual components or groups of components wired together into modules. The severing and separating can be done with a jet process or by sawing. Surface layers, and in particular metallizations that are to be severed, can be structured in advance if appropriate and can then be removed by wet chemical processes or by plasma etching.

What is claimed is:

1. A component comprising:
    a chip having a top surface and having a bottom surface that includes electrically conductive structures;
    a carrier substrate having a top surface that includes connecting areas, the chip being mounted in a flip chip arrangement on the carrier substrate via electrically conductive connections between the electrically conductive structures and the connecting areas;
    a support element at the top surface of the carrier substrate, the support element surrounding the chip but not touching the chip; and a seal that borders the chip and the support element;
wherein the support element supports the seal;
wherein the support element and the seal are configured to reduce an affect of mechanical forces on the electrically conductive connections that results from temperature variations;
wherein the seal comprises a composite comprising a dielectric layer and a metal layer, the composite forming a seal to the carrier substrate outside of an area that corresponds to the chip; and
wherein the chip has a thickness such that a force resulting from thermal expansion of an electrically conductive connection in a temperature range between −60° C. and 85° C. is a maximum of 2 Newtons.

2. A component comprising:
a chip having a top surface and having a bottom surface that includes electrically conductive structures;
a carrier substrate having a top surface that includes connecting areas, the chip being mounted in a flip chip arrangement on the carrier substrate via electrically conductive connections between the electrically conductive structures and the connecting areas;
a support element at the top surface of the carrier substrate, the support element surrounding the chip but not touching the chip; and
a seal that borders the chip and the support element;
wherein the support element supports the seal;
wherein the support element and the seal are configured to reduce an affect of mechanical forces on the electrically conductive connections that results from temperature variations;
wherein the seal comprises a composite comprising a dielectric layer and a metal layer above the dielectric layer relative to the top surface of the chip, the composite forming a seal to the carrier substrate outside of an area that corresponds to the chip; and
wherein the dielectric layer has a modulus of elasticity of less than 1 Gpa, a thickness of less than 20 µm, or a coefficient of thermal expansion that is greater than $\alpha_{bump}/2$ and that is less than $2\alpha_{bump}$, where $\alpha_{bump}$ is a coefficient of thermal expansion for at least one of the electrically conductive connections.

3. The component of claim 1 or 2, wherein the electrically conductive connections comprise bumps.

4. The component of claim 1 or 2, wherein the support element comprises a shrink frame that substantially encloses the chip.

5. The component of claim 4; wherein the shrink frame forms a seal to the carrier substrate.

6. The component of claim 1 or 2, wherein the chip has side surfaces that are sloped so that a cross-section of the chip tapers toward the carrier substrate.

7. The component of claim 1 or 2, wherein the chip has side surfaces that comprise at least one step.

8. The component of claim 1 or 2, wherein the seal covers edge areas of the chip and the support element; and
wherein the seal does not cover the top surface of the chip.

9. The component of claim 1 or 2, wherein the metal layer is over edge areas of the support element and/or on edge areas of the carrier substrate.

10. The component of claim 1 or 2, wherein the dielectric layer completely covers the chip and the support element, the dielectric layer forming a seal to the carrier substrate only in areas that do not correspond to the support element so that the chip and the support element are in a shared space that is formed between the dielectric layer and the top surface of the carrier substrate.

11. The component of claim 1 or 2, wherein the dielectric layer completely covers the top surface of the chip and seals to the support element, the support element comprising a hermetically tight material.

12. The component of claim 1 or 2, further comprising a filling compound on the dielectric layer.

13. The component of claim 12, wherein the metal layer forms a seal to the carrier substrate outside of an area that corresponds to the support element.

14. The component of claim 1 or 2, further comprising a contact metallization on side surfaces of the chip that face the carrier substrate;
wherein the support element comprises a solder frame, the support element being soldered to a contact metallization of the chip.

15. The component of claim 1 or 2, further comprising a metal layer on a top surface of the chip.

16. The component of claim 1 or 2, wherein the dielectric layer comprises at least one of a plastic, an organic plastic, a laminate film, a glass solder and a resin.

17. The component of claim 1 or 2, wherein the support element comprises at least one of metal, a ceramic material and plastic.

18. The component of claim 1 or 2, wherein the support element corresponds to a boundary of an indentation on the carrier substrate.

19. The component of claim 1 or 2, wherein a height of the support element does not exceed a distance between the top surface of the carrier substrate and a bottom edge of the chip; and
wherein an the inner edge of the support element is under the bottom edge of the chip.

20. The component of claim 1 or 2, wherein a height of the support element corresponds to, or exceeds, a distance between the top surface of the carrier substrate and a bottom edge of the chip.

21. The component of claim 1 or 2, wherein the carrier substrate comprises a lower temperature cofired ceramic.

22. The component of claim 1 or 2, further comprising surface-mounted-device-capable external contacts on a bottom surface of the carrier substrate.

23. The component of claim 1 or 2, wherein the carrier substrate comprises at least two dielectric layers.

24. The component of claim 1 or 2, wherein the chip comprises at least one surface acoustic wave resonator or at least one bulk acoustic wave resonator.

25. The component of claim 1 or 2, further comprising one or more additional chips that are attached to the carrier substrate and that are encapsulated using at least one support element and seal.

* * * * *

UNITED STATES PATENT AND TRADEMARK OFFICE
CERTIFICATE OF CORRECTION

PATENT NO. : 7,388,281 B2 Page 1 of 1
APPLICATION NO. : 10/523875
DATED : June 17, 2008
INVENTOR(S) : Hans Krueger It is certified that error appears in the above-identified patent and that said Letters Patent is hereby corrected as shown below:

Column 14, Claim 19, Line 38;
Delete "the" between "an" and "inner"

Column 14, Claim 21, Line 46;
Delete "lower" and insert -- low --

Signed and Sealed this

Fourteenth Day of April, 2009

JOHN DOLL
*Acting Director of the United States Patent and Trademark Office*